(12) United States Patent
Jin

(10) Patent No.: US 9,607,689 B2
(45) Date of Patent: Mar. 28, 2017

(54) SOLID HARD DISK AND CHARGING/DISCHARGING CONTROL METHOD FOR FLASH CHIP

(71) Applicant: RAMAXEL TECHNOLOGY (SHENZHEN) LIMITED, Shenzhen (CN)

(72) Inventor: Ming Jin, Shenzhen (CN)

(73) Assignee: Ramaxel Technology (Shenzhen) Limited, Shenzhen, Guangdong (CN)

( * ) Notice: Subject to any disclaimer, the term of this patent is extended or adjusted under 35 U.S.C. 154(b) by 0 days.

(21) Appl. No.: 14/646,596

(22) PCT Filed: Apr. 28, 2013

(86) PCT No.: PCT/CN2013/074922
§ 371 (c)(1),
(2) Date: May 21, 2015

(87) PCT Pub. No.: WO2014/079202
PCT Pub. Date: May 30, 2014

(65) Prior Publication Data
US 2015/0279455 A1  Oct. 1, 2015

(30) Foreign Application Priority Data
Nov. 23, 2012 (CN) .......................... 2012 1 0480708

(51) Int. Cl.
*G11C 11/56* (2006.01)
(52) U.S. Cl.
CPC .. *G11C 11/5628* (2013.01); *G11C 2211/5648* (2013.01)

(58) Field of Classification Search
CPC ................... G11C 11/5628; G11C 2211/5648
See application file for complete search history.

(56) References Cited

U.S. PATENT DOCUMENTS 8,514,621 B2  8/2013 Choi et al.
2008/0056007 A1*  3/2008 Kang .................. G11C 11/5628
365/185.22

(Continued)

FOREIGN PATENT DOCUMENTS

| CN | 102270501 A | 12/2011 |
|---|---|---|
| CN | 103019616 A | 4/2013 |
| EP | 1533702 A1 | 5/2005 |

*Primary Examiner* — J. H. Hur
(74) *Attorney, Agent, or Firm* — Maschoff Brennan

(57) ABSTRACT

A method comprises steps of mapping a same physical page to two mutually coupled logic pages, one logic page being formed by mapping the least significant bit on the physical page, and the other logic page being formed by mapping the most significant bit on the physical page; buffering write data in a buffer memory, and merging the data, which is corresponding to the two mutually coupled logic pages, in the buffer memory into a piece of data corresponding to the physical page according to the mapping relationship between the physical page and the two mutually coupled logic pages; and performing charging/discharging control for the multi-layer memory cell of the physical page according to the merged data, so that a voltage state of the multi-layer memory cell is expressed as a numerical value of the merged data.

4 Claims, 3 Drawing Sheets

(56) References Cited

U.S. PATENT DOCUMENTS

| | | | |
|---|---|---|---|
| 2008/0205161 A1* | 8/2008 | Kang | G11C 11/5628 365/185.23 |
| 2008/0273385 A1* | 11/2008 | Goda | G11C 5/145 365/185.03 |
| 2010/0034019 A1* | 2/2010 | Kang | G11C 11/5628 365/185.03 |
| 2010/0097842 A1* | 4/2010 | Hwang | G11C 11/56 365/148 |
| 2012/0014184 A1* | 1/2012 | Dutta | G11C 11/5628 365/185.19 |

* cited by examiner

SOLID HARD DISK AND CHARGING/DISCHARGING CONTROL METHOD FOR FLASH CHIP

TECHNICAL FIELD

The present invention relates to the field of storage technologies, and particularly to a solid hard disk and a charging/discharging control method for a flash chip.

BACKGROUND ART

NAND-type flash memories can be divided into SLC (Single-Level Cell) NAND-type flash memories and MLC NAND-type flash memories according to the digits that can be stored in each memory cell.

Each memory cell of an SLC NAND-type flash chip may have two states: a high voltage state and a low voltage state, which represent the data 0 and 1, respectively. Such a memory cell may represent a data bit. A plurality of physical memory cells form a physical page, which may represent a same number of bits, namely a logic page.

Each memory cell of an MLC NAND-type flash chip may have four voltage states. MLC represents different data according to different voltage values. FIG. 1 is a schematic view illustrating voltage distribution of a memory cell of an MLC NAND-type flash chip, wherein MLC represents the data 11 when the voltage is between 0 and A, MLC represents the data 10 when the voltage is between A and B, MLC represents the data 01 when the voltage is between B and C, and MLC represents the data 00 when the voltage is between C and D. Such a memory cell may represent two data bits, and a physical page of an MLC NAND-type flash chip has bits 2 times the bits of a physical page of an SLC NAND-type flash chip.

Generally two logic pages of a same size as a physical page will be divided, wherein the low 0 or 1 forms an LSB (least significant bit), and the high 0 or 1 forms an MSB (most significant bit); that is to say, the two logic pages (the pages formed of the LSB and the MSB, respectively) share one physical page. In FIG. 1, the most significant bit (MSB) is on the left-most side of the binary data, and the least significant bit (LSB) is on the right-most side of the binary data.

Assuming the first voltage state (11) has an electron number of 0, the second voltage state (10) has an electron number of n, the third voltage state (00) has an electron number of 2n, and the fourth voltage state (01) has an electron number of 3n. Hereinafter the process of charging/discharging the read-write of a solid hard disk in the prior art is analyzed in detail by taking different orders as two examples.

1. Firstly, write data to a least significant bit (LSB), and then write data to a most significant bit (MSB); the data change relationship is shown in FIG. 2.

As data is first written to a least significant bit (LSB), the written data may be 1 or 0 and, accordingly, the data change relationship is as follows: 11 is changed into 11, or 11 is changed into 10. When 11 is changed into 11, a multi-layer memory cell does not need to be charged or discharged; when 11 is changed into 10, it needs to be charged with n electrons.

As data is then written to a most significant bit (MSB), the written data may be 1 or 0 and, accordingly, the data change relationship is as follows: 11 is changed into 11, or 11 is changed into 01, or 10 is changed into 10, or 10 is changed into 00. When 11 is changed into 11 or 10 is changed into 10, there is no real change, and it does not need to be charged or discharged; when 11 is changed into 01, it needs to be charged with 3n electrons; when 10 is changed into 00, it needs to be charged with n electrons.

2. Firstly, write data to a most significant bit (MSB), and then write data to a least significant bit (LSB); the data change relationship is shown in FIG. 3.

As data is first written to a most significant bit (MSB), the written data may be 1 or 0 and, accordingly, the data change relationship is as follows: 11 is changed into 11, or 11 is changed into 01. When 11 is changed into 11, it does not need to be charged or discharged; when 11 is changed into 01, it needs to be charged with 3n electrons.

As data is then written to a least significant bit (LSB), the written data may be 1 or 0 and, accordingly, the data change relationship is as follows: 11 is changed into 11, or 11 is changed into 10, or 01 is changed into 01, or 01 is changed into 00. When 11 is changed into 11 or 01 is changed into 01, there is no real change, and it does not need to be charged or discharged; when 11 is changed into 10, it needs to be charged with n electrons; when 01 is changed into 00, n electrons need to be discharged.

From the above analysis, when 1 is written to both the least significant bit (LSB) and the most significant bit (MSB) of the multi-layer memory cell, it does not need to be charged or discharged; when 0 is written to only one of the least significant bit (LSB) and the most significant bit (MSB) of the multi-layer memory cell, it needs to be charged once; when 0 is written to both the least significant bit (LSB) and the most significant bit (MSB) of the multi-layer memory cell and first written to the least significant bit (LSB), it needs to be charged twice; when 0 is written to both the least significant bit (LSB) and the most significant bit (MSB) of the multi-layer memory cell and first written to the most significant bit (MSB), it needs to be charged once and discharged once. In this way, since the LSB and MSB of an MLC-type flash chip share a physical memory cell, when the LSB or MSB is being programmed, the physical memory cell needs to be charged or discharged, and the times of frequent charging/discharging reduce the times of erasure of the MLC-type flash chip, resulting in abrasion of the flash chip and reducing the service life of the flash chip.

To sum up, the practical application of the existing charging/discharging control methods for MLC NAND-type flash chips is obviously inconvenient and deficient, thus it is necessary to make an improvement.

SUMMARY

To overcome the above-mentioned defects, it is an object of the present invention to provide a solid hard disk and a charging/discharging control method for a flash chip, which can avoid repeated charging/discharging of the multi-layer memory cell, reduce the times of charging/discharging and abrasion of the flash chip, and prolong the service life of the flash chip.

To this end, the present invention provides a charging/discharging control method for a flash chip used in a solid hard disk, wherein a physical page of the flash chip comprises a plurality of multi-layer memory cells. The method comprises the steps of:

mapping a same physical page to two mutually coupled logic pages, one logic page being formed by mapping the least significant bit on the physical page, and the other logic page being formed by mapping the most significant bit on the physical page;

buffering write data in a buffer memory, and merging the data, which is corresponding to the two mutually coupled logic pages, in the buffer memory into a piece of data corresponding to the physical page according to the mapping relationship between the physical page and the two mutually coupled logic pages; and performing charging/discharging control for the multi-layer memory cell of the physical page according to the merged data, so that a voltage state of the multi-layer memory cell is expressed as a numerical value of the merged data.

In the charging/discharging control method according to the present invention, the step of merging the data, which is corresponding to the two mutually coupled logic pages, in the buffer memory into a piece of data corresponding to the physical page according to the mapping relationship between the physical page and the two mutually coupled logic pages comprises:

determining whether data, which is corresponding to a coupled logic page with a logic page corresponding to the write data, has been written and buffered in the buffer memory; and if so, merging data corresponding to the logic page and the coupled logic page into a piece of data corresponding to the physical page, otherwise waiting for the writing and buffering of the next data in the buffer memory until data corresponding to the coupled logic page is written.

The charging/discharging control method according to the present invention further comprises, after the step of waiting for the writing and buffering of the next data in the buffer memory until data corresponding to the coupled logic page is written:

if a timeout has occurred, because waiting time is too long, and if data has been written to a coupled logic page with a current logic page, reading the data of the coupled logic page to the buffer memory, and merging it and the buffered data of the current 5 logic page into a piece of data corresponding to the physical page.

The charging/discharging control method according to the present invention further comprises, after the step of waiting for the writing and buffering of the next data in the buffer memory until data corresponding to the coupled logic page is written:

if a timeout has occurred, because waiting time is too long, and if no data has been written to a coupled logic page with a current logic page, setting the data of the coupled logic page as full 1, and merging it and the buffered data of the current logic page into a piece of data corresponding to the physical page.

In accordance with the charging/discharging control method according to the present invention, in the step of mapping the same physical page to two mutually coupled logic pages, each multi-layer memory cell of the flash chip has four voltage states, which are represented as four binary data 11, 10, 00 and 01, respectively; the most significant bit is on the left-most side of the binary data, and the least significant bit is on the right-most side of the binary data.

The present invention correspondingly provides a solid hard disk comprising a plurality of flash chips, a physical page of the flash chip comprising a plurality of multi-layer memory cells, the solid hard disk further comprising:

a mapping module adapted to map a same physical page to two mutually coupled logic pages, one logic page being formed by mapping the least significant bit on the physical page, and the other logic page being formed by mapping the most significant bit on the physical page;

a buffer memory adapted to buffering write data;

a data merging module adapted to merge data, which is corresponding to the two mutually coupled logic pages, in the buffer memory into a piece of data corresponding to the physical page according to the mapping relationship between the physical page and the two mutually coupled logic pages; and a charging/discharging controller adapted to perform charging/discharging control for the multi-layer memory cell of the physical page according to the merged data, so that a voltage state of the multi-layer memory cell is expressed as a numerical value of the merged data.

In accordance with the solid hard disk according to the present invention, the solid hard disk further comprises a determination module adapted to determine whether data, which is corresponding to a coupled logic page with a logic page corresponding to the write data, has been written and buffered in the buffer memory; and if so, merge data corresponding to the logic page and the coupled logic page into a piece of data corresponding to the physical page, otherwise wait for the writing and buffering of the next data in the buffer memory until data corresponding to the coupled logic page is written.

In accordance with the solid hard disk according to the present invention, if a timeout has occurred, because waiting time is too long, and if data has been written to a coupled logic page with a current logic page, the solid hard disk reads the data of the coupled logic page to the buffer memory, and merges it and the buffered data of the current logic page into a piece of data corresponding to the physical page.

In accordance with the solid hard disk according to the present invention, if a timeout has occurred, because waiting time is too long, and if no data has been written to a coupled logic page with a current logic page, the solid hard disk sets the data of the coupled logic page as full 1, and merges it and the buffered data of the current logic page into a piece of data corresponding to the physical page.

In accordance with the solid hard disk according to the present invention, each multi-layer memory cell of the flash chip has four voltage states, which are represented as four binary data 11, 10, 00 and 01, respectively; the most significant bit is on the left-most side of the binary data, and the least significant bit is on the right-most side of the binary data.

According to the present invention, a same physical page is mapped to two mutually coupled logic pages. In the course of writing data, the write data is first buffered; and when data has been written both to a certain logic page and a logic page coupled therewith, the buffered data corresponding to the certain logic page and the coupled logic page are merged into a piece of data corresponding to the physical page according to the mapping relationship between the physical page and the two mutually coupled logic pages. Then charging/discharging control is performed for a multi-layer memory cell of the physical page according to the merged data, so that a voltage state of the multi-layer memory cell is expressed as a numerical value of the merged data. That is to say, data is written to the least significant bit (LSB) and the most significant bit (MSB) of the physical page simultaneously, so that a predetermined number of electrons all can be charged once. Compared with the method in the prior art of not buffering data but directly writing data corresponding to a logic page to a physical page in the course of writing data, the present invention can avoid repeated charging/discharging of the multi-layer memory cell, reduce the times of charging/discharging and abrasion of the flash chip, and prolong the service life of the flash chip.

DETAILED DESCRIPTION

To clarify the object, technical solutions and advantages of the present invention, the present invention will be further explained in detail hereinafter with reference to the accompanying drawings and embodiments. It should be appreciated that the specific embodiments described herein are merely intended to illustrate the present invention but are not limited thereto.

Figure 1:
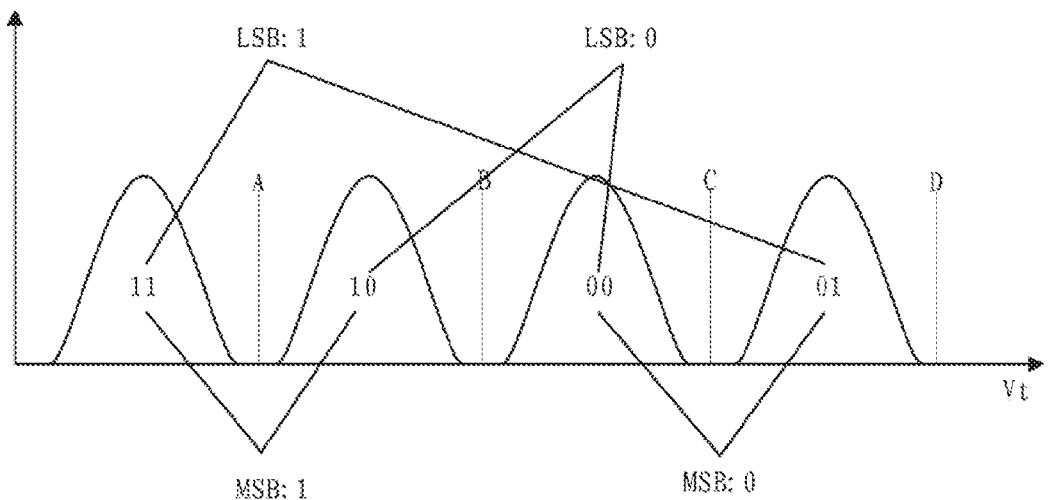
FIG. 1 is a schematic view illustrating voltage distribution in a memory cell of an MLC NAND-type flash chip in the prior art.
Figure 2:
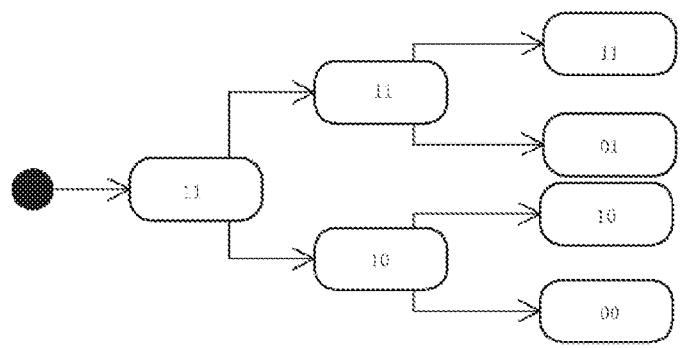
FIG. 2 is a schematic view illustrating data change relationship in the charging/discharging process for read-write of a solid hard disk in the prior art, wherein data is firstly written to a least significant bit and then written to a most significant bit.
Figure 3:
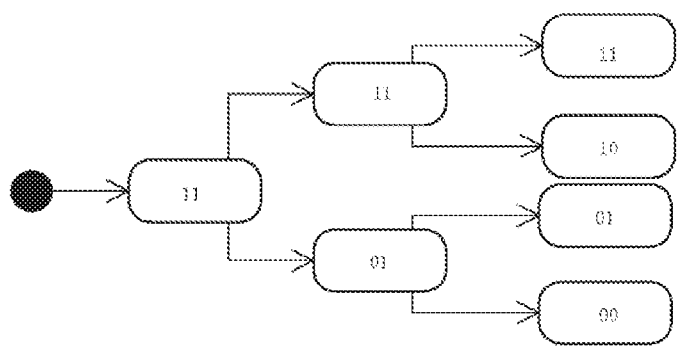
FIG. 3 is a schematic view illustrating data change relationship in the charging/discharging process for read-write of a solid hard disk in the prior art, wherein data is firstly written to a most significant bit and then written to a least significant bit.
Figure 4:
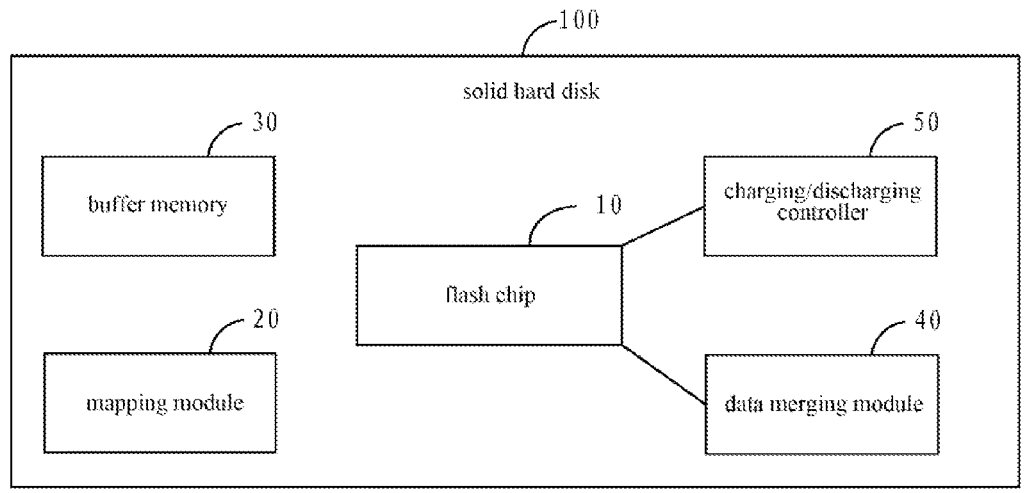
FIG. 4 is a diagram illustrating a principle construction of a solid hard disk of the present invention.

As shown in FIG. 4, a solid hard disk 100 according to the present invention comprises a plurality of flash chips 10, each of which has a plurality of physical pages, each physical page comprising a plurality of multi-layer memory cells. The solid hard disk 100 further comprises a mapping module 20, a buffer memory 30, a data merging module 40 and a charging/discharging controller 50, wherein the data merging module 40 and the charging/discharging controller 50 are electrically connected to the multi-layer memory cells of the flash chip 10.

The mapping module 20 is adapted to map a same physical page to two mutually coupled logic pages, which are a high-order logic page and a low-order logic page, respectively. The high-order logic page is formed by mapping the most significant bit on the physical page, and the low-order logic page is formed by mapping the least significant bit on the physical page.

Since each physical page has a plurality of multi-layer memory cells, each multi-layer memory cell has four voltage states, which are represented as four binary data 11, 10, 00 and 01, respectively. The most significant bit is on the left-most side of the binary data, and the least significant bit is on the right-most side of the binary data. The least significant bit of the four binary data is mapped to the low-order logic page, and the most significant bit is mapped to the high-order logic page, i.e. the two logic pages share one physical page.

The buffer memory 30 is adapted to buffer write data. A flash translation layer of the solid hard disk 100 does not write the data to a relevant logic page immediately upon receipt of the write data, instead, it buffers the data and waits for the writing of data to a coupled page with the current logic page, wherein the data written to the coupled page is also stored in the buffer memory 30 temporarily, herein a coupled page with the current logic page means a logic page sharing the same physical page with the current logic page.

Figure 5:
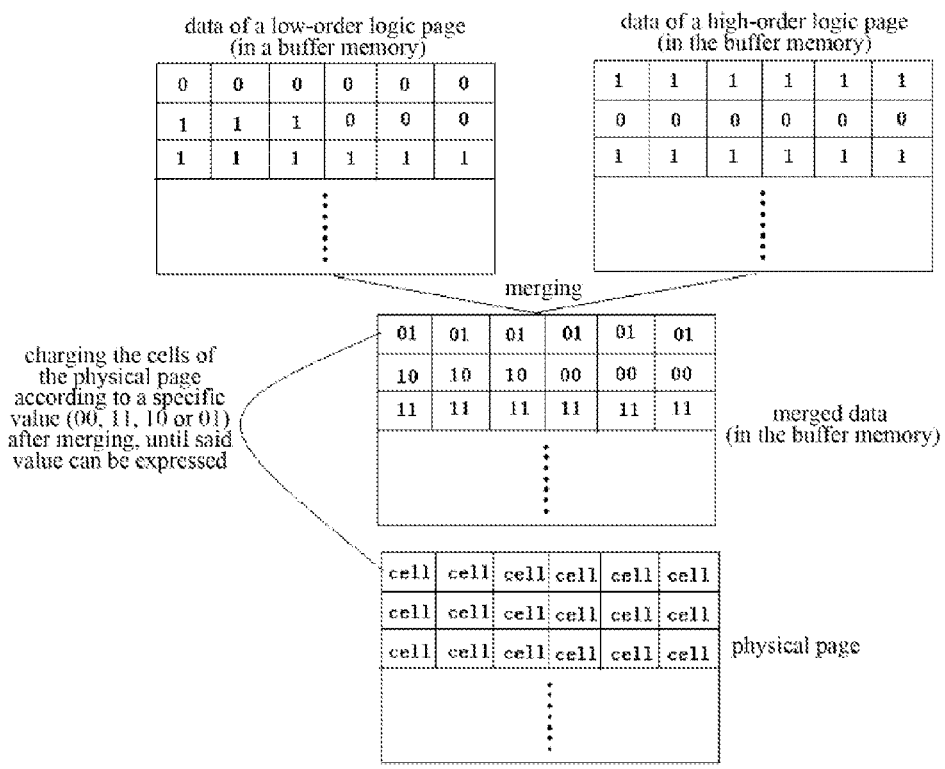
FIG. 5 is a schematic diagram illustrating a principle of charging/discharging of a solid hard disk in an example of the present invention.

The data merging module 40 is adapted to merge data, which is corresponding to the two mutually coupled logic pages, in the buffer memory 30 into a piece of data corresponding to the physical page according to the mapping relationship between the physical page and the two mutually coupled logic pages. Only when data is written to both a certain logic page and a logic page coupled therewith, are the buffered data corresponding to the certain logic page and the logic page coupled therewith merged into a piece of data corresponding to the physical page. Specifically, as shown in FIG. 5, corresponding bits are extracted from the data of the two mutually coupled logic pages, so that one of the four data 11, 10, 00 and 01 can be constituted, so as to be merged into a piece of data corresponding to the physical page. The size of the piece of data corresponds to a storage space of a physical page, and a specific location thereof can be determined according to a logic-physical address mapping table. Meanwhile, the merged data is still stored in the buffer memory 30.

The charging/discharging controller 50 is adapted to perform charging/discharging control for the multi-layer memory cell of the physical page according to the merged data, so that the voltage state of the multi-layer memory cell is expressed as a numerical value of the merged data. Specifically, the charging/discharging controller 50 directly charges a multi-layer memory cell of the physical page with a desired number of electrons all once according to a value of data needed to be written to the multi-layer memory cell (i.e. the merged data in the buffer memory 30), enabling to express the numerical value in the buffer memory. In this way, programming of two logic pages can be completed by just one charging, whereby the service life of the flash chip 10 can be prolonged.

In the present invention, only when data is written to both a certain logic page and a logic page coupled therewith, the buffered data corresponding to the certain logic page and the logic page coupled therewith is merged into a piece of data corresponding to the physical page, and then charging/discharging control is performed. That is, data is written to the least significant bit (LSB) and the most significant bit (MSB) simultaneously, so that a predetermined number of electrons all can be charged once, without the need of repeated charging/discharging. For example, in the prior art, when data is changed from 11 into 00, 0 is written to both the least significant bit and the most significant bit of a multi-layer memory cell and data is first written to the most significant bit, it is necessary to firstly charge the multi-layer memory cell with 3n electrons and then release n electrons; however, in the present invention, when data is changed from 11 into 00, charging 2n electrons directly is enough and only one charging is required, thereby reducing the times of charging/discharging of the multi-layer memory cell.

Preferably, the solid hard disk further comprises a determination module for determining whether data, which is corresponding to a coupled logic page with a logic page corresponding to the write data, has been written and buffered in the buffer memory 30. If so, the data merging module 40 will merge data corresponding to the logic page and the coupled logic page into a piece of data corresponding to the physical page and then charging/discharging control is performed; otherwise it waits for the writing and buffering of the next data in the buffer memory 30 until data corresponding to the coupled logic page is written.

When a piece of data corresponding to a logic page has been buffered and the arrival of the data corresponding to the coupled logic page is waited, if waiting time is too long, a timeout will occur and timeout processing will be performed. The timeout processing involves the following two cases: if a timeout occurs and if data has been written to a coupled logic page with a current logic page, the solid hard disk 100 reads the data of the coupled logic page to the buffer memory 30, merges it and the buffered data of the current logic page into a piece of data corresponding to the physical page, and then performs charging/discharging control. That is, if data has been written to the waited logic page, data is read to the buffer memory 30 so as to charge a physical memory cell in combination with the first piece of buffered data that already exists. In a case where a timeout occurs and if no data has been written to a coupled logic page with a current logic page, the solid hard disk 100 sets the data of the coupled logic page as full 1, and merges it and the buffered data of the current logic page into a piece of data corresponding to the physical page, and then performs charging/discharging control. That is, if data has not been written to the waited logic page, a corresponding buffer thereof may be set as full 1 so as to charge a physical memory cell in combination with the first piece of buffered data. Therefore, when the arrival of another piece of data is waited for a high-order or low-order logic page, in a case of timeout, a corresponding buffer thereof will be configured depending on whether data has been written to the waited logic page, and then the manner of charging will be decided according to the two pieces of data buffer, so to avoid too much data in the buffer memory 30 that would influence a data processing speed of the solid hard disk.

Figure 6:
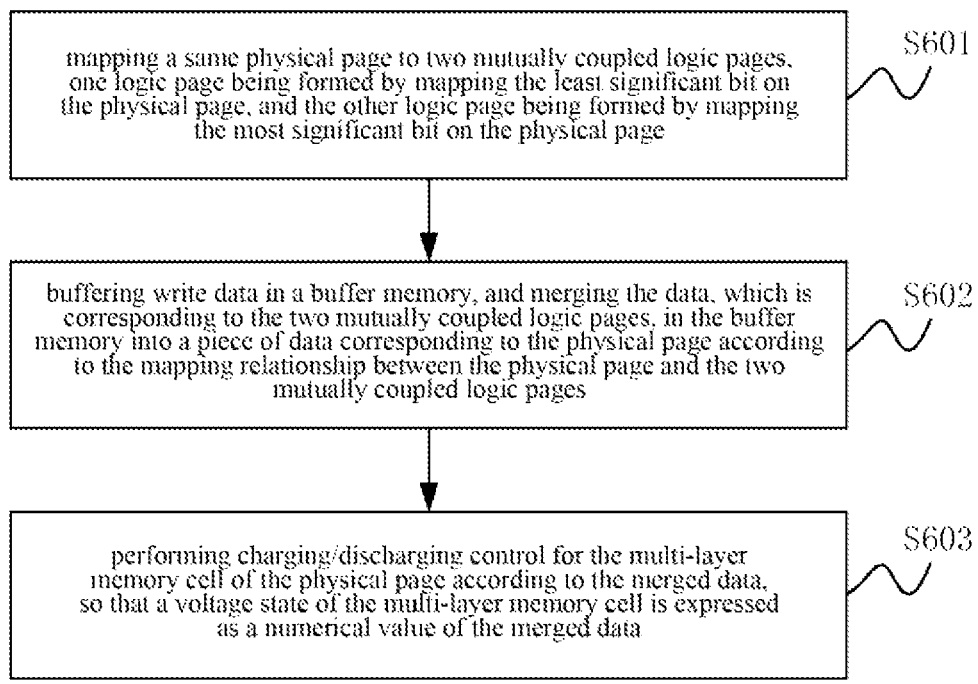
FIG. 6 is a flow chart illustrating a charging/discharging control method for a flash chip according to the present invention.

As shown in FIG. 6, the present invention correspondingly provides a charging/discharging control method for a flash chip, which is carried out by means of the solid hard disk 100 as shown in FIG. 4. The method comprises Step S601 to Step S603 as follows.

Step S601: mapping a same physical page to two mutually coupled logic pages, one logic page being formed by mapping the least significant bit on the physical page, and the other logic page being formed by mapping the most significant bit on the physical page. This step is performed by the mapping module 20. Each multi-layer memory cell of the flash chip 10 has four voltage states, which are represented as four binary data 11, 10, 00 and 01, respectively; the most significant bit is on the left-most side of the binary data, and the least significant bit is on the right-most side of the binary data.

Step S602: buffering write data, and merging data, which is corresponding to the two mutually coupled logic pages, in a buffer memory into a piece of data corresponding to the physical page according to the mapping relationship between the physical page and the two mutually coupled logic pages. This step is performed by the buffer memory 30 and the data merging module 40 together.

Step S603: performing charging/discharging control for a multi-layer memory cell of the physical page according to the merged data, so that the voltage state of the multi-layer memory cell is expressed as a numerical value of the merged data. This step is performed by the charging/discharging controller 50.

Preferably, the step S602 further comprises determining whether data, which is corresponding to a coupled logic page with a logic page corresponding to the write data, has been written and buffered in the buffer memory; and if so, merging data corresponding to the logic page and the coupled logic page into a piece of data corresponding to the physical page, otherwise waiting for the writing and buffering of the next data in the buffer memory until data corresponding to the coupled logic page is written; in a case where a timeout occurs, because waiting time is too long, and if data has been written to a coupled logic page with a current logic page, reading the data of the coupled logic page to the buffer memory, and merging it and the buffered data of the current logic page into a piece of data corresponding to the physical page; and in a case where a timeout occurs and if no data has been written to a coupled logic page with a current logic page, setting the data of the coupled logic page as full 1, and merging it and the buffered data of the current logic page into a piece of data corresponding to the physical page.

To sum up, according to the present invention, a same physical page is mapped to two mutually coupled logic pages. In the course of writing data, the write data is first buffered; and when data has been written both to a certain logic page and a logic page coupled therewith, the buffered data corresponding to the certain logic page and the coupled logic page are merged into a piece of data corresponding to the physical page according to the mapping relationship between the physical page and the two mutually coupled logic pages. Then charging/discharging control is performed for a multi-layer memory cell of the physical page according to the merged data, so that a voltage state of the multi-layer memory cell is expressed as a numerical value of the merged data. That is to say, data is written to the least significant bit (LSB) and the most significant bit (MSB) of the physical page simultaneously, so that a predetermined number of electrons all can be charged once. Compared with the method in the prior art of not buffering data but directly writing data corresponding to a logic page to a physical page in the course of writing data, the present invention can avoid repeated charging/discharging of the multi-layer memory cell, reduce the times of charging/discharging and abrasion of the flash chip, and prolong the service life of the flash chip.

Of course, the present invention may have a variety of other embodiments. Those skilled in the art can make all kinds of corresponding changes and modifications according to the present invention without departing from the spirit and essence of the present invention. It is intended that all these changes and modifications are covered by the appended claims of the present invention.

The invention claimed is:

1. A charging/discharging control method for a flash chip used in a solid hard disk, a physical page of the flash chip comprising a plurality of multi-layer memory cells, wherein the method comprises the steps of:
   mapping the physical page to two mutually coupled logic pages, wherein the two mutually coupled logic pages comprise a low-order logic page and a high-order logic page, the low-order logic page being formed by mapping a least significant bit of the plurality of multi-layer memory cells on the physical page to the low-order logic page, and the high-order logic page being formed by mapping a most significant bit of the plurality of multi-layer memory cells on the physical page to the high-order logic page;
   buffering write data, wherein the write data corresponds to at least one of the two mutually coupled logic pages, in a buffer memory;
   determining whether the write data corresponds to only one of the two mutually coupled logic pages or both of the two mutually coupled logic pages,
      if the write data corresponds to both of the two mutually coupled logic pages, merging the write data in the buffer memory into merged data corresponding to the physical page according to a mapping relationship between the physical page and the two mutually coupled logic pages, and
if the write data corresponds to only one of the two mutually coupled logic pages, waiting a period of time for write data corresponding to the other of the two mutually coupled logic pages to be buffered in the buffered memory;
determining if a timeout for the waiting period has occurred,
in response to the timeout occurring and if the write data corresponds to both of the two mutually coupled logic pages, merging the write data in the buffer memory into the merged data corresponding to the physical page; and
in response to the timeout occurring, and if the write data corresponds to only one of the two mutually coupled logic pages, setting the mutually coupled logic page that the buffered write data does not correspond to as full 1, and merging the write data including the mutually coupled logic page set as full 1 into the merged data corresponding to the physical page; and
performing charging/discharging control for the plurality of multi-layer memory cells on the physical page according to the merged data corresponding to the physical page, so that a voltage state of the plurality of multi-layer memory cells is expressed as a numerical value of the merged data corresponding to the physical page.

2. The charging/discharging control method according to claim 1, wherein in the step of mapping the physical page to two mutually coupled logic pages, each of the plurality of multi-layer memory cells of the flash chip has four voltage states, which are represented as four binary data 11, 10, 00 and 01, respectively; the most significant bit is on the left-most side of the binary data, and the least significant bit is on the right-most side of the binary data.

3. A solid hard disk comprising a plurality of flash chips, a physical page of the plurality of the flash chips comprising a plurality of multi-layer memory cells, wherein the solid hard disk further comprises:
a mapping module configured to map the physical page to two mutually coupled logic pages, wherein the two mutually coupled logic pages comprise a low-order logic page and a high-order logic page, the low-order logic page being formed by mapping a least significant bit of the plurality of multi-layer memory cells on the physical page to the low-order logic page, and the high-order logic page being formed by mapping a most significant bit of the plurality of multi-layer memory cells on the physical page to the high-order logic page;
a buffer memory configured to buffer write data, wherein the write data corresponds to at least one of the two mutually coupled logic pages;
a data merging module configured to merge the write data in the buffer memory into merged data corresponding to the physical page according to a mapping relationship between the physical page and the two mutually coupled logic pages, and:
determine whether the write data corresponds to only one of the two mutually coupled logic pages or both of the two mutually coupled logic pages,
if the write data corresponds to both of the two mutually coupled logic pages, merging the write data in the buffer memory into the merged data corresponding to the physical page, and
if the write data corresponds to only one of the two mutually coupled logic pages, waiting a period of time for write data corresponding to the other of the two mutually coupled logic pages to be buffered in the buffered memory;
determining if a timeout for the waiting period has occurred,
in response to the timeout occurring and if the write data corresponds to both of the two mutually coupled logic pages, the write data is buffered in the buffer memory and merged into the merged data corresponding to the physical page, and
in response to the timeout occurring and if the write data corresponds to only one of the two mutually coupled logic pages, the mutually coupled logic page that the write data does not correspond to is set as full 1 and the write data including the mutually coupled logic page set as full 1 is merged into the merged data corresponding to the physical page; and
a charging/discharging controller configured to perform charging/discharging control for the plurality of multi-layer memory cells on the physical page according to the merged data corresponding to the physical page, so that a voltage state of the plurality of multi-layer memory cells is expressed as a numerical value of the merged data corresponding to the physical page.

4. The solid hard disk according to claim 3, wherein each of the plurality of multi-layer memory cells of the flash chip has four voltage states, which are represented as four binary data 11, 10, 00 and 01, respectively; the most significant bit is on the left-most side of the binary data, and the least significant bit is on the right-most side of the binary data.

* * * * *